United States Patent
Kim et al.

(10) Patent No.: US 10,873,258 B1
(45) Date of Patent: Dec. 22, 2020

(54) SEMICONDUCTOR DEVICE INCLUDING CHARGE PUMP CIRCUIT

(71) Applicant: SK hynix Inc., Gyeonggi-do (KR)

(72) Inventors: Jong-Seok Kim, Seoul (KR); Geon-Hwi Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/732,982

(22) Filed: Jan. 2, 2020

(30) Foreign Application Priority Data

Jun. 19, 2019 (KR) .................. 10-2019-0072861

(51) Int. Cl.
    *H02M 3/07* (2006.01)
    *G11C 5/14* (2006.01)

(52) U.S. Cl.
    CPC ............. *H02M 3/073* (2013.01); *G11C 5/145* (2013.01)

(58) Field of Classification Search
    CPC ............................... H02M 3/073; G11C 5/145
    See application file for complete search history.

(56) References Cited

U.S. PATENT DOCUMENTS

| | | | | |
|---|---|---|---|---|
| 6,456,153 | B2 * | 9/2002 | Buck ...................... | H02M 3/07 327/536 |
| 7,583,133 | B2 * | 9/2009 | Ivanov ................... | H02M 3/07 327/536 |
| 9,385,596 | B1 | 7/2016 | Yang | |
| 9,985,519 | B2 * | 5/2018 | Suzuki .................. | G11C 16/30 |

FOREIGN PATENT DOCUMENTS

| | | | |
|---|---|---|---|
| KR | 02006014795 | * | 2/2006 |
| KR | 10-2006-0065364 | | 6/2006 |

* cited by examiner

*Primary Examiner* — Dinh T Le
(74) *Attorney, Agent, or Firm* — IP & T Group LLP (57) ABSTRACT

A semiconductor device includes a charge pump circuit suitable for generate an output voltage by pumping an input voltage according to first and second main clocks; a voltage detection circuit suitable for generating a comparison signal by comparing the output voltage with a reference voltage; and a driving control circuit suitable for generating the first and second main clocks according to first and second external clocks during an activation time period of the comparison signal while controlling a transition sequence such that the second main clock transitions after the first main clock transitions.

16 Claims, 10 Drawing Sheets

| CK90_S | CK00_S | SEL<3:0> | CK90_SEL | CK00_SEL |
|--------|--------|----------|----------|----------|
| 0 | 0 | 0001 | CK90EB | CK00EB |
| 0 | 1 | 0010 | CK90EB | CK00ED |
| 1 | 0 | 0100 | CK90ED | CK00EB |
| 1 | 1 | 1000 | CK90ED | CK00ED |

SEMICONDUCTOR DEVICE INCLUDING CHARGE PUMP CIRCUIT

CROSS-REFERENCE TO RELATED APPLICATION

This application claims priority under 35 U.S.C. § 119(a) to Korean Patent Application No. 10-2019-0072861, filed on Jun. 19, 2019, the disclosure of which is incorporated herein by reference in its entirety.

BACKGROUND

1. Field

Various embodiments of the present invention relate to a semiconductor design technique, and more particularly, to a charge pump circuit of a semiconductor device.

2. Description of the Related Art

In the operation of nonvolatile memory devices, such as flash memory or electrically erasable programmable read-only memory (EEPROM) devices, or volatile memory devices such as dynamic random access memory (DRAM) devices, high voltages are required for program and erase operations. These high voltages can be internally generated at a higher level than an external supply voltage. A charge pump circuit can be used to generate such high voltages.

In various fields at present, charge pump circuits are being developed to improve voltage multiplier efficiency and power efficiency.

SUMMARY

Various embodiments are directed to a semiconductor device including a charge pump circuit, capable of minimizing/reducing current consumption due to input clocks of the charge pump circuit.

In accordance with an embodiment, a semiconductor device includes: a charge pump circuit suitable for generate an output voltage by pumping an input voltage according to first and second main clocks; a voltage detection circuit suitable for generating a comparison signal by comparing the output voltage with a reference voltage; and a driving control circuit suitable for generating the first and second main clocks according to first and second external clocks during an activation time period of the comparison signal while controlling a transition sequence such that the second main clock transitions after the first main clock transitions.

In accordance with an embodiment, an operating method of a semiconductor device includes: generating an output voltage by pumping an input voltage according to first and second main clocks; comparing the output voltage with a reference voltage to generate and output a comparison signal; generating an output enable signal by determining whether a transition sequence of first and second external clocks meets a condition, based on logic levels of first and second preliminary clocks, during an activation time period of the comparison signal; outputting the first and second main clocks by latching the first and second external clocks according to the output enable signal; and storing the first and second main clocks as the first and second preliminary clocks, respectively, at an end of the activation time period of the comparison signal.

In accordance with an embodiment, an operating method of a semiconductor device includes: generating first and second main clocks by respectively latching first and second external clocks according to an output enable signal; generating an output voltage by pumping an input voltage according to the first and second main clocks; generating a comparison signal by comparing the output voltage with a reference voltage; and generating the output enable signal by determining whether a transition sequence of first and second external clocks meets a condition during an activation time period of the comparison signal.

DETAILED DESCRIPTION

Various embodiments of the present invention are described below in more detail with reference to the accompanying drawings. In doing so, description of well-known functions or configurations are omitted so as not to unnecessarily obscure the subject matter of the present invention. Throughout the disclosure, like reference numerals refer to like parts. Also, throughout the specification, reference to "an embodiment," "another embodiment" or the like is not necessarily to the same embodiment, and different references to any such phrase are not necessarily to the same embodiment(s).

It will be understood that, although the terms "first", "second", "third", and so on may be used herein to identify various elements, these elements are not limited by these terms. These terms are used to distinguish one element from another element that otherwise have the same or similar names. Thus, a first element in one instance could be termed a second or third element in another instance without indicating any change in form or substance to the underlying element.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present. Communication between two elements, whether directly or indirectly connected/coupled, may be wired or wireless, unless stated or the context indicates otherwise.

As used herein, singular forms may include the plural forms as well and vice versa, unless the context clearly indicates otherwise. The articles 'a' and 'an' as used in this application and the appended claims should generally be construed to mean 'one or more' unless specified otherwise or clear from context to be directed to a singular form.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Hereinafter, various embodiments of the present invention are described in detail with reference to the attached drawings.

Figure 1:
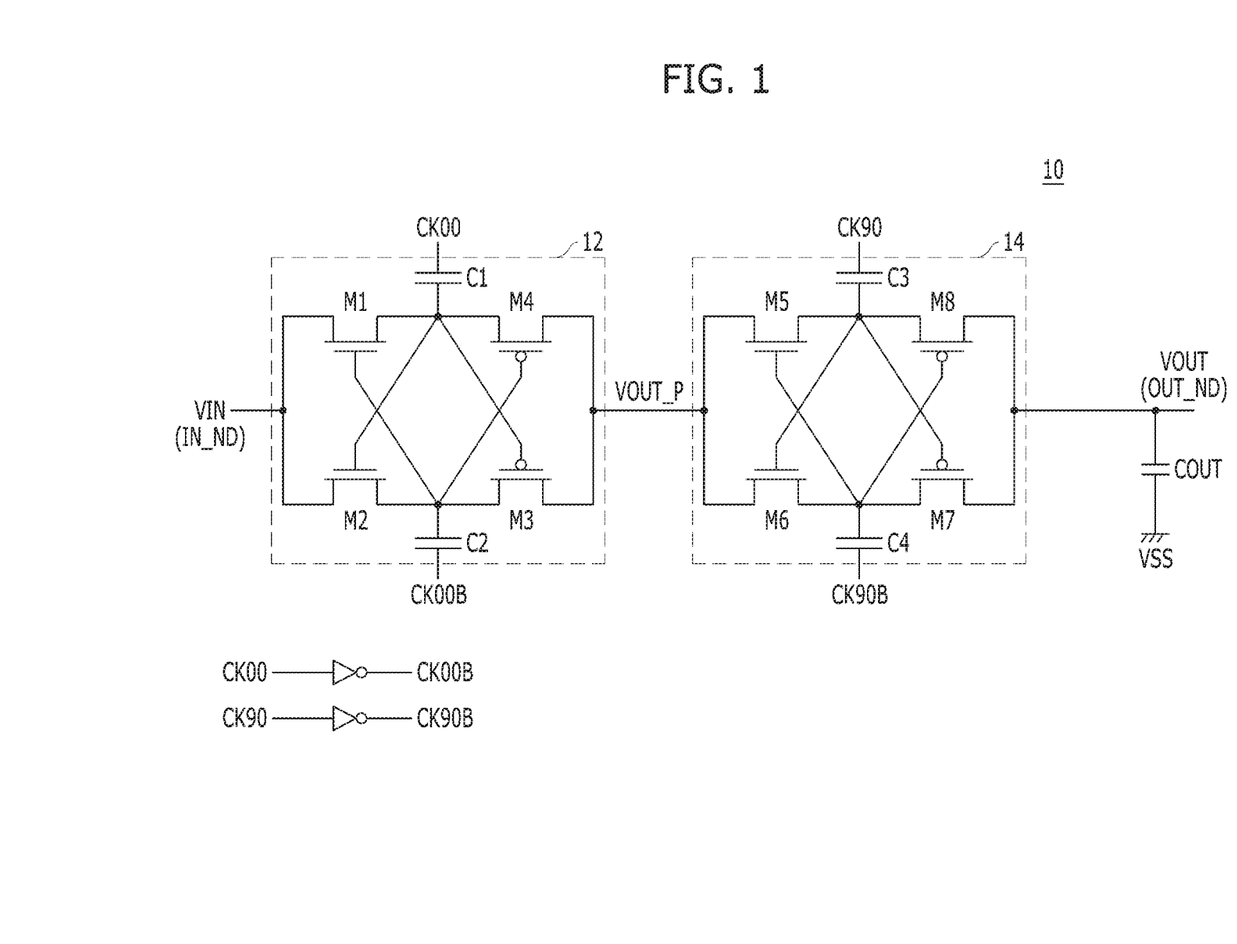
FIG. 1 is a circuit diagram illustrating a charge pump circuit of a cross-coupled type in accordance with an embodiment of the present invention.

FIG. 1 is a circuit diagram illustrating a charge pump circuit 10 of a cross-coupled type in accordance with an embodiment of the present invention.

Referring to FIG. 1, the charge pump circuit 10 may include a first pump circuit 12, a second pump circuit 14 and an output capacitor COUT.

Though FIG. 1 shows the charge pump circuit 10 in which two pump stages, i.e., the first and second pump circuits 12 and 14, are coupled in series, the present invention is not limited thereto. In an embodiment, the second pump circuit 14 may be configured to be coupled to a switch (not shown) in parallel. When the switch is turned on, a first output voltage VOUT_P from the first pump circuit 12 is directly provided to an output terminal OUT_ND. In another embodiment, the charge pump circuit 10 may include two or more pump stages coupled in series. In this case, the charge pump circuit 10 may additionally include one or more switches (not shown), each of which is coupled to a corresponding pump stage in parallel. By controlling turn on of the switches according to load capacitance of an output terminal, a level of an output voltage may be adjusted. As a result, the charge pump circuit 10 can be used universally by adjusting the level of the output voltage applied to the output terminal OUT_ND.

The first and second pump circuits 12 and 14 may operate according to a pair of complementary clocks, each having an opposite phase. For example, a pair of first complementary clocks may include a first main clock CK00 and a first sub clock CK00B, and a pair of second complementary clocks may include a second main clock CK90 and a second sub clock CK90B. The first pump circuit 12 may generate the first output voltage VOUT_P by pumping an input voltage VIN at an input terminal IN_ND according to the first main clock CK00 and the first sub clock CK00B. The first main clock CK00 may have an opposite phase to the first sub clock CK00B, and the same period as the first sub clock CK00B. For example, when the first main clock CK00 has a logic high level, the first sub clock CK00B has a logic low level. When the first main clock CK00 has a logic low level, the first sub clock CK00B has a logic high level. The first sub clock CK00B may be generated by inverting the first main clock CK00.

The second pump circuit 14 may generate a second output voltage VOUT at the output terminal OUT_ND by pumping the first output voltage VOUT_P according to the second main clock CK90 and the second sub clock CK90B. The second main clock CK90 may have an opposite phase to the second sub clock CK09B, and the same period as the second sub clock CK09B. For example, when the second main clock CK90 has a logic high level, the second sub clock CK90B has a logic low level. When the second main clock CK90 has a logic low level, the second sub clock CK90B has a logic high level. The second sub clock CK90B may be generated by inverting the second main clock CK90. Preferably, the first main clock CK00 and the second main clock CK90 have a phase difference of 90 degree, and the first sub clock CK00B and the second sub clock CK90B have a phase difference of 90 degree.

The output capacitor COUT may be coupled between the output terminal OUT_ND and a ground voltage (VSS) terminal.

The first pump circuit 12 may include first to fourth transistors M1 to M4 and first and second capacitors C1 and C2. The second pump circuit 14 may include fifth to eighth transistors M5 to M8 and third and fourth capacitors C3 and C4. The first capacitor C1 may have a first terminal receiving the first main clock CK00, the second capacitor C2 may have a first terminal receiving the first sub clock CK00B, the third capacitor C3 may have a first terminal receiving the second main clock CK90, and the fourth capacitor C4 may have a first terminal receiving the second sub clock CK90B.

Since the second pump circuit 14 has substantially the same configuration as the first pump circuit 12, the first pump circuit 12 is described as an example.

The first transistor M1 may be coupled between the input terminal IN_ND and a second terminal of the first capacitor C1, and have a gate receiving the first sub clock CK00B transferred through the second capacitor C2. The second transistor M2 may be coupled between the input terminal IN_ND and a second terminal of the second capacitor C2, and have a gate receiving the first main clock CK00 transferred through the first capacitor C1. The third transistor M3 may be coupled between the second terminal of the second capacitor C2 and an output node at which the first output voltage VOUT_P is outputted, and have a gate receiving the first main clock CK00 transferred through the first capacitor C1. The fourth transistor M4 may be coupled between the second terminal of the first capacitor C1 and the output node, and have a gate receiving the first sub clock CK00B transferred through the second capacitor C2. Preferably, the first and second transistors M1 and M2 may be implemented with an N-channel metal oxide semiconductor (NMOS) transistor, and the third and fourth transistors M3 and M4 may be implemented with a P-channel metal oxide semiconductor (PMOS) transistor.

When the charge pump circuit 10 includes two or more pump stages coupled in series, odd-numbered pump stages in the series may be driven according to the first main clock CK00 and the first sub clock CK00B, whereas the even-numbered pump stages in the series may be driven according to the second main clock CK90 and the second sub clock CK90B.

Figure 2:
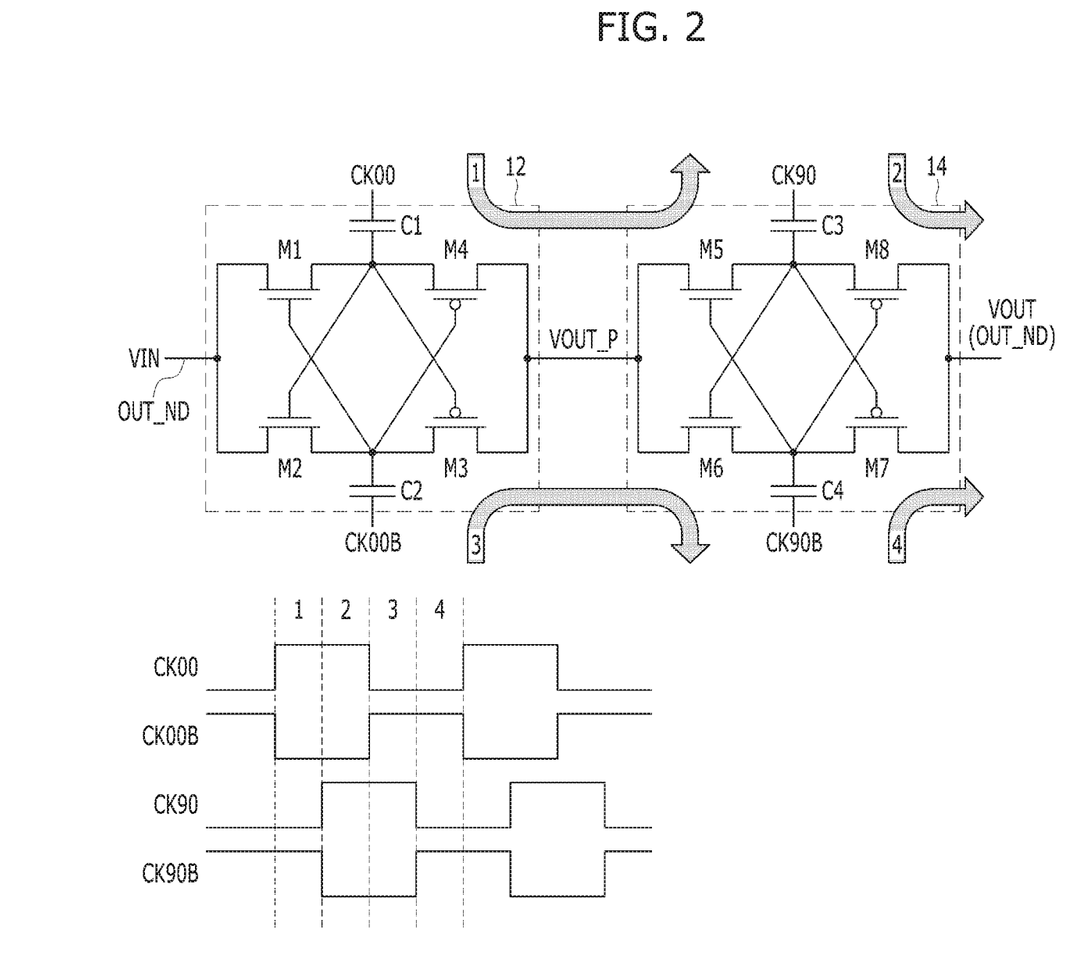
FIG. 2 is a timing diagram describing an operation of a charge pump circuit, such as that shown in FIG. 1.

FIG. 2 is a timing diagram describing an operation of the charge pump circuit 10 shown in FIG. 1.

Referring to FIG. 2, operations of the first pump circuit 12 and the second pump circuit 14 are described.

[A First Section]

During the first section or first time period, the first main clock CK00 becomes a logic high level, and the first sub clock CK00B becomes a logic low level. The first transistor M1 and the third transistor M3 are turned off, and the second transistor M2 and the fourth transistor M4 are turned on. The second main clock CK90 becomes a logic low level, and the second sub clock CK90B becomes a logic high level. The fifth transistor M5 and the seventh transistor M7 are turned on, and the sixth transistor M6 and the eighth transistor M8 are turned off.

As a result, a voltage charged at the first capacitor C1 is discharged and provided to the second pump circuit 14 as the first output voltage VOUT_P. The first output voltage VOUT_P provided to the second pump circuit 14 is charged at the third capacitor C3 through the fifth transistor M5. At this time, the input voltage VIN at the input terminal IN_ND is charged at the second capacitor C2 through the second transistor M2, and a voltage charged at the fourth capacitor C1 is discharged and outputted to the output terminal OUT_ND as the second output voltage VOUT.

[A Second Section]

During the second section or second time period, in a state that the first main clock CK00 and the first sub clock CK00B maintain the same phases as those of the first section, the second main clock CK90 transitions to a logic high level, and the second sub clock CK90B transitions to a logic low level. The fifth transistor M5 and the seventh transistor M7 are turned off, and the sixth transistor M6 and the eighth transistor M8 are turned on. As a result, a voltage charged at the third capacitor C3 is discharged and provided to the output terminal OUT_ND as the second output voltage VOUT. At this time, the first output voltage VOUT_P is charged at the fourth capacitor C4 through the sixth transistor M6.

[A Third Section]

During the third section or third time period, in a state that the second main clock CK90 and the second sub clock CK90B maintain the same phases as those of the second section, the first main clock CK00 transitions to a logic low level, and the first sub clock CK00B transitions to a logic high level. The first transistor M1 and the third transistor M3 are turned on. A voltage charged at the second capacitor C2 is discharged and provided to the second pump circuit 14 as the first output voltage VOUT_P. Since the sixth transistor M6 is turned on, the first output voltage VOUT_P is charged at the fourth capacitor C4 through the sixth transistor M6. At this time, the input voltage VIN at the input terminal IN_ND is charged at the first capacitor C1 through the first transistor M1.

[A Fourth Section]

During the fourth section or fourth time period, in a state that the first main clock CK00 and the first sub clock CK00B maintain the same phases as those of the third section, the second main clock CK90 transitions to a logic low level, and the second sub clock CK90B transitions to a logic high level. The fifth transistor M5 and the seventh transistor M7 are turned on, and the sixth transistor M6 and the eighth transistor M8 are turned off. A voltage charged at the fourth capacitor C4 is discharged and provided to the output terminal OUT_ND as the second output voltage VOUT. At this time, the first output voltage VOUT_P is charged at the third capacitor C3 through the fifth transistor M5.

As described above, as the first and second main clocks CK00 and CK90 and the first and second sub clocks CK00B and CK90B are toggling, the operations for the first to fourth sections repeatedly performed. As a result, the second output voltage VOUT at the output terminal OUT_ND is charged at the output capacitor (COUT of FIG. 1), thereby being outputted as a final output voltage.

Figure 3:
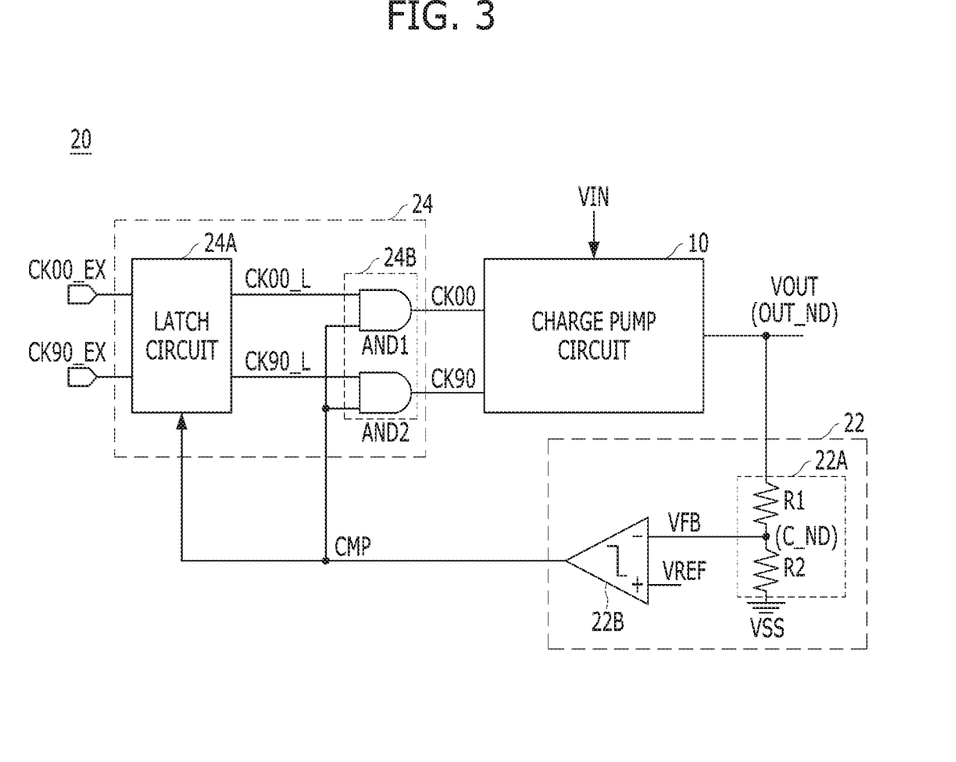
FIG. 3 is a block diagram illustrating a semiconductor device to which a charge pump circuit, such as that shown in FIG. 1, is embedded.

FIG. 3 is a block diagram illustrating a semiconductor device 20 to which the charge pump circuit 10 shown in FIG. 1 is embedded.

Referring to FIG. 3, the semiconductor device 20 may include the charge pump circuit 10, a voltage detection circuit 22, and a driving control circuit 24.

The charge pump circuit 10 may have substantially the same structure and operation as those of FIGS. 1 and 2.

The voltage detection circuit 22 may generate a comparison signal CMP by comparing an output voltage VOUT with a reference voltage VREF. The voltage detection circuit 22 may include a divider 22A and a comparator 22B.

The divider 22A may divide the output voltage VOUT according to a set ratio to output a detection voltage VFB. The divider 22A may include first and second resistors R1 and R2 coupled in series between an output terminal OUT_ND and a ground voltage (VSS) terminal. The divider 22A may output the detection voltage VFB at a common terminal C_ND between the first and second resistors R1 and R2. The comparator 22B may output the comparison signal CMP by comparing the detection voltage VFB with the reference voltage VREF. The comparator 22B may activate the comparison signal CMP to a high level when the detection voltage VFB is lower than the reference voltage VREF. Preferably, a band-gap voltage with a constant voltage level regardless of changes in an external supply voltage may be used as the reference voltage VREF.

The driving control circuit 24 may latch first and second external clocks CK00_EX and CK90_EX according to the comparison signal CMP to output first and second main clocks CK00 and CK90. The driving control circuit 24 may include a latch circuit 24A and an output circuit 24B.

The latch circuit 24A may detect each rising edge of the first and second external clocks CK00_EX and CK90_EX during an activation section or activation time period of the comparison signal CMP, and output first and second intermediate clocks CK00_L and CK90_L. The first and second intermediate clocks CK00_L and CK90_L may have substantially the same activation section as the first and second external clocks CK00_EX and CK90_EX, respectively. The output circuit 24B may output the first and second intermediate clocks CK00_L and CK90_L as the first and second main clocks CK00 and CK90, respectively, during the activation section of the comparison signal CMP. The output circuit 24B may include a first logic gate AND1 and a second logic gate AND2. The first logic gate AND1 may perform a logic AND operation on the first intermediate clock CK00_L and the comparison signal CMP to output the first main clock CK00. The second logic gate AND2 may perform a logic AND operation on the second intermediate clock CK90_L and the comparison signal CMP to output the second main clock CK90.

Figure 4A:
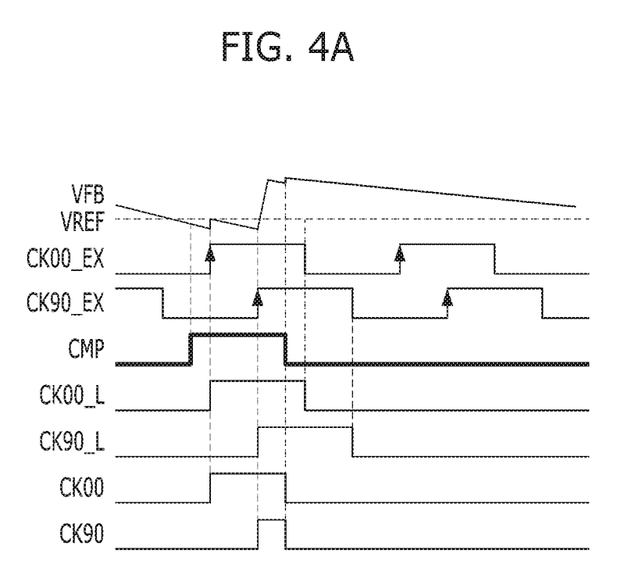
FIGS. 4A and 4B are timing diagrams describing an operation of a semiconductor device, such as that shown in FIG. 3.
Figure 4B:
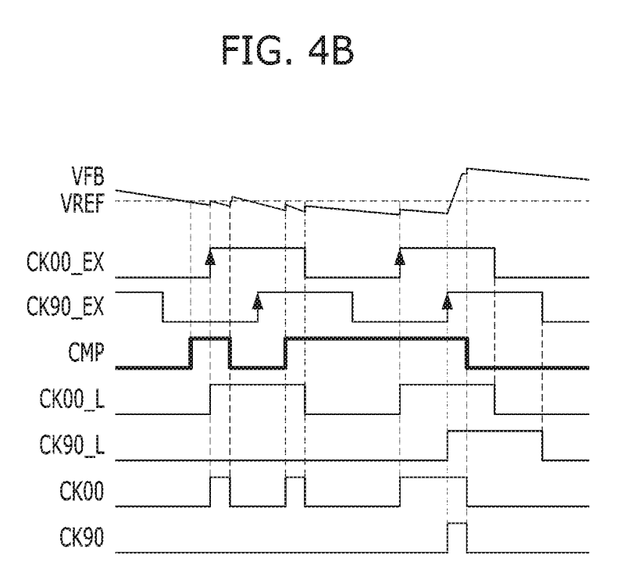

FIGS. 4A and 4B are timing diagrams describing an operation of the semiconductor device 20 shown in FIG. 3.

Referring to FIGS. 4A and 4B, the voltage detection circuit 22 may generate the comparison signal CMP by comparing the output voltage VOUT with the reference voltage VREF. The voltage detection circuit 22 may activate the comparison signal CMP to a high level when the detection voltage VFB is lower than the reference voltage VREF. The latch circuit 24A may detect each rising edge of the first and second external clocks CK00_EX and CK90_EX during the activation section of the comparison signal CMP, and output the first and second intermediate clocks CK00_L and CK90_L. The output circuit 24B may output the first and second intermediate clocks CK00_L and CK90_L as the first and second main clocks CK00 and CK90, respectively, during the activation section of the comparison signal CMP. That is, during the activation section of the comparison signal CMP, the driving control circuit 24 may activate the first and second main clocks CK00 and CK90 for a certain period by detecting each rising edge of the first and second external clocks CK00_EX and CK90_EX, and deactivate the first and second main clocks CK00 and CK90 at an end of the activation section or time period of the comparison signal CMP.

In a case shown in FIG. 4A, the first and second main clocks CK00 and CK90 may simultaneously transition at the end of the activation section/time period of the comparison signal CMP, i.e., a falling edge of the comparison signal CMP. Since switching operations of the clocks are simultaneously performed, a peak current consumed due to the switching operations may increase. In a case shown in FIG. 4B, only the first main clock CK00 toggles during the activation section of the comparison signal CMP. The second main clock CK90 does not toggle during that time. Since the second main clock CK90 does not toggle even if the first main clock CK00 toggles, the operations for the first to fourth sections described in FIG. 2 may not be repeatedly performed. Thus, the charge pump circuit 10 does not pump an input voltage VIN. Even when the first main clock CK00 is toggling, the output voltage VOUT is not generated, which increases a current consumption due to unnecessary switching operations.

Hereinafter, a semiconductor device including a charge pump circuit, capable of minimizing/reducing current consumption due to input clocks of the charge pump circuit, is explained in detail.

Figure 5:
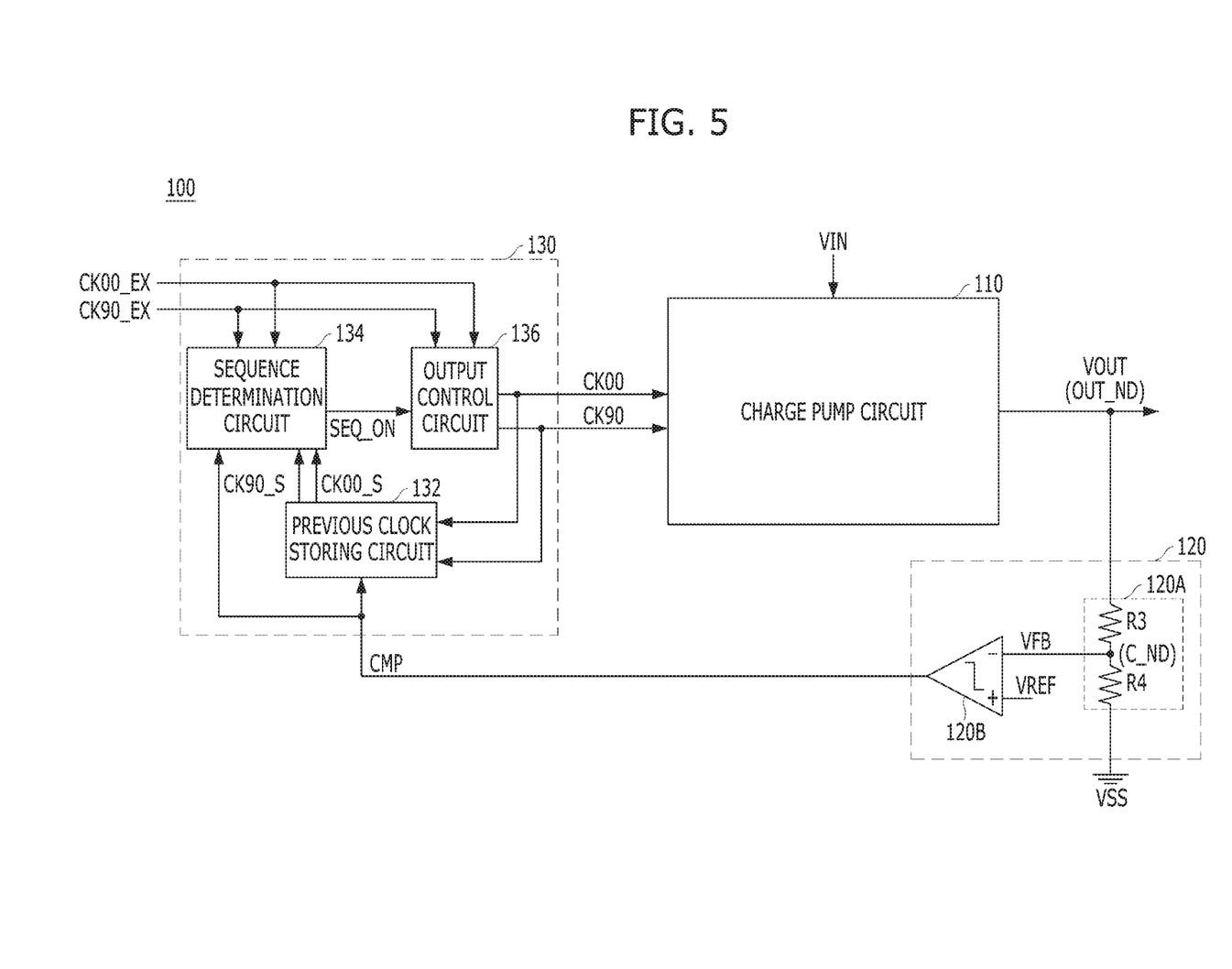
FIG. 5 is a block diagram illustrating a semiconductor device to which a charge pump circuit is embedded, in accordance with an embodiment of the present invention.

FIG. 5 is a block diagram illustrating a semiconductor device 100 to which a charge pump circuit is embedded, in accordance with an embodiment of the present invention.

Referring to FIG. 5, the semiconductor device 100 may include a charge pump circuit 110, a voltage detection circuit 120, and a driving control circuit 130.

The charge pump circuit 110 may generate an output voltage VOUT by pumping an input voltage VIN according to a first main clock CK00 and a second main clock CK90. The charge pump circuit 110 may perform a pumping operation on the input voltage VIN to increase a level of the output voltage VOUT according to the first main clock CK00 and the second main clock CK90. The charge pump circuit 110 may have substantially the same structure and operation of the charge pump circuit 10 as those of FIGS. 1 and 2.

The voltage detection circuit 120 may generate a comparison signal CMP by comparing the output voltage VOUT with a reference voltage VREF. The voltage detection circuit 120 may include a divider 122 and a comparator 124.

The divider 122 may divide the output voltage VOUT according to a set ratio to output a detection voltage VFB. The divider 122 may include first and second resistors R3 and R4 coupled in series between an output terminal OUT_ND and a ground voltage (VSS) terminal. The divider 122 may output the detection voltage VFB at a common terminal C_ND between the first and second resistors R3 and R4. The comparator 124 may output the comparison signal CMP by comparing the detection voltage VFB with the reference voltage VREF. The comparator 124 may activate the comparison signal CMP to a high level when the detection voltage VFB is lower than the reference voltage VREF. Preferably, a band-gap voltage with a constant voltage level regardless of changes in an external supply voltage may be used as the reference voltage VREF.

The driving control circuit 130 may generate first and second main clocks CK00 and CK90 according to first and second external clocks CK00_EX and CK90_EX during an activation section of the comparison signal CMP. In particular, the driving control circuit 130 in accordance with an embodiment may control the first and second main clocks CK00 and CK90 to transition according to a transition sequence. The driving control circuit 130 may control the transition sequence such that the second main clock CK90 transitions after the first main clock CK00 transitions. During the activation section of the comparison signal CMP, the driving control circuit 130 may control the second main clock CK90 to transition to a logic high level from a logic low level after the first main clock CK00 transitions to a logic high level from a logic low level. During the activation section of the comparison signal CMP, the driving control circuit 130 may control the second main clock CK90 to transition to a logic low level from a logic high level after the first main clock CK00 transitions to a logic low level from a logic high level. Further, the driving control circuit 130 in accordance with an embodiment may control the first and second main clocks CK00 and CK90 to maintain their logic levels at an end of the activation section/time period of the comparison signal CMP.

In detail, the driving control circuit 130 may include a previous clock storing circuit 132, a sequence determination circuit 134 and an output control circuit 136.

The previous clock storing circuit 132 may store the first and second main clocks CK00 and CK90 as first and second preliminary clocks CK00_S and CK90_S, respectively, according to the comparison signal CMP. The previous clock storing circuit 132 may store the first and second main clocks CK00 and CK90 at the end of the activation section/time period of the comparison signal CMP, i.e., in synchronization with a falling edge of the comparison signal CMP.

The sequence determination circuit 134 may generate an output enable signal SEQ_ON by determining whether a transition sequence of the first and second external clocks CK00_EX and CK90_EX meets a certain condition, based on the first and second preliminary clocks CK00_S and CK90_S, during the activation section of the comparison signal CMP. The certain condition may be that the second external clock CK90_EX transitions to a logic high level from a logic low level after the first external clock CK00_EX transitions to a logic high level from a logic low level, or, alternatively, that the second external clock CK90_EX transitions to a logic low level from a logic high level after the first external clock CK00_EX transitions to a logic low level from a logic high level. In detail, the sequence determination circuit 134 may generate a selection signal (SEL<3:0> of FIG. 6) by decoding logic levels of the first and second preliminary clocks CK00_S and CK90_S. The sequence determination circuit 134 may select one of the first external clock CK00_EX and an inverted signal (not shown) of the first external clock CK00_EX, and output a first sequence selection signal (CK00_SEL of FIG. 6), according to the selection signal SEL<3:0>. The sequence determination circuit 134 may select one of the second external clock CK90_EX and an inverted signal (not shown) of the second external clock CK90_EX, and output a second sequence selection signal (CK90_SEL of FIG. 6), according to the selection signal SEL<3:0>. The sequence determination circuit 134 may generate the output enable signal SEQ_ON according to the comparison signal CMP, the first sequence selection signal CK00_SEL and the second sequence selection signal CK90_SEL.

The output control circuit 136 may output the first and second main clocks CK00 and CK90 by latching the first and second external clocks CK00_EX and CK90_EX according to the output enable signal SEQ_ON.

As described above, the driving control circuit 130 in accordance with an embodiment may control a transition sequence such that the second main clock CK90 transitions after the first main clock CK00 transitions. Further, the driving control circuit 130 in accordance with an embodiment may control the first and second main clocks CK00 and CK90 to maintain their logic levels at the end of the activation section/time period of the comparison signal CMP. Accordingly, the semiconductor device 100 can control the first and second main clocks CK00 and CK90 not to simultaneously transition, and can minimize/reduce current consumption due to unnecessary switching operations.

Figure 6:
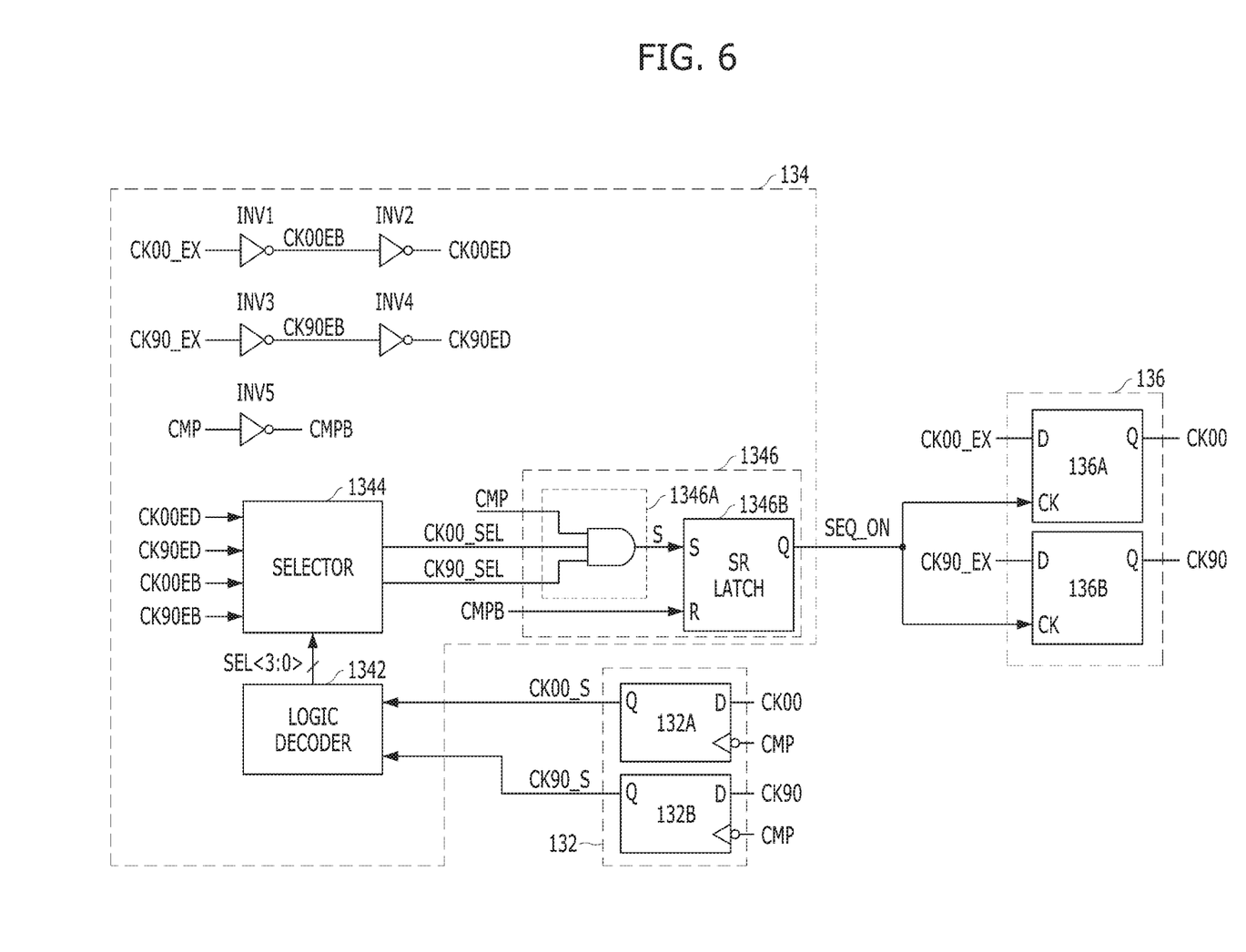
FIG. 6 is a circuit diagram illustrating a driving control circuit, such as that shown in FIG. 5.
Figure 7:
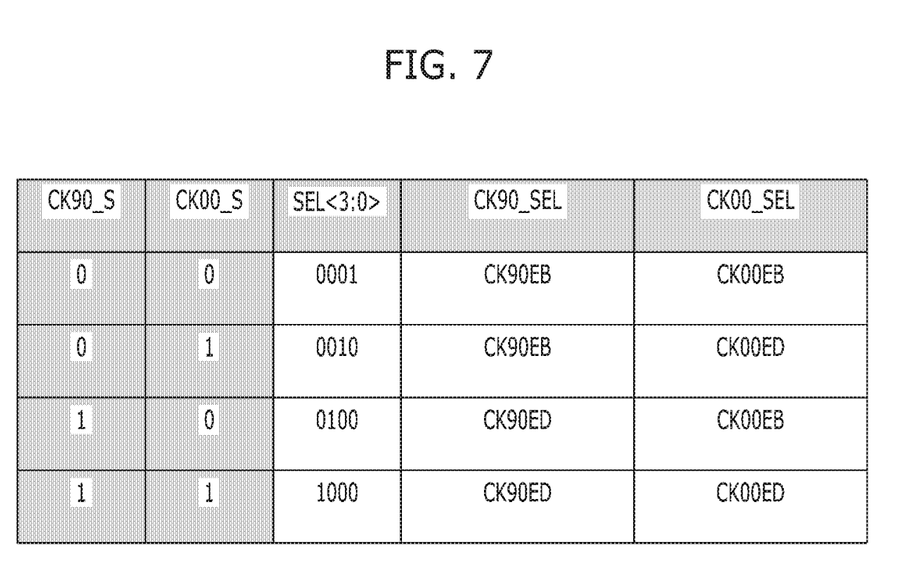
FIG. 7 is a truth table describing an operation of a driving control circuit, such as that shown in FIG. 6.

FIG. 6 is a circuit diagram illustrating the driving control circuit 130 shown in FIG. 5. FIG. 7 is a truth table describing an operation of the driving control circuit 130 shown in FIG. 6.

Referring to FIG. 6, detailed circuit diagrams of the previous clock storing circuit 132, the sequence determination circuit 134 and the output control circuit 136 are shown.

The previous clock storing circuit 132 may include a first storage 132A and a second storage 132B. The first storage 132A may store the first main clock CK00 to output the first preliminary clock CK00_S, at the end of the activation section/time period of the comparison signal CMP. The second storage 132B may store the second main clock CK90 to output the second preliminary clock CK90_S, at the end of the activation section/time period of the comparison signal CMP. Preferably, the first storage 132A and the second storage 132B may be implemented with D flip-flop which is synchronized with the falling edge of the comparison signal CMP.

The sequence determination circuit 134 may include a logic decoder 1342, a selector 1344, and an enable signal generator 1346.

The logic decoder 1342 may generate the selection signal SEL<3:0> by decoding logic levels of the first and second preliminary clocks CK00_S and CK90_S. For example, as shown in FIG. 7, the logic decoder 1342 may generate the selection signal SEL<3:0> of "0001" when both of the first and second preliminary clocks CK00_S and CK90_S have a logic low level. The logic decoder 1342 may generate the selection signal SEL<3:0> of "0010" when the first preliminary clock CK00_S has a logic high level and the second preliminary clock CK90_S has a logic low level. The logic decoder 1342 may generate the selection signal SEL<3:0> of "0100" when the first preliminary clock CK00_S has a logic low level and the second preliminary clock CK90_S has a logic high level. The logic decoder 1342 may generate the selection signal SEL<3:0> of "1000" when both of the first and second preliminary clocks CK00_S and CK90_S have a logic high level.

The sequence determination circuit 134 may further include first to fifth inverters INV1 to INV5. The first inverter INV1 may invert the first external clock CK00_EX to output a first negative clock CK00EB, and the second inverter INV2 may invert the first negative clock CK00EB to output a first positive clock CK00ED. The third inverter INV3 may invert the second external clock CK90_EX to output a second negative clock CK90EB, and the fourth inverter INV4 may invert the second negative clock CK90EB to output a second positive clock CK90ED. The fifth inverter INV5 may invert the comparison signal CMP to output an inverted comparison signal CMPB.

The selector 1344 may select one of the first positive clock CK00ED and the first negative clock CK00EB according to the selection signal SEL<3:0>, and output the first sequence selection signal CK00_SEL. The selector 1344 may select one of the second positive clock CK90ED and the second negative clock CK90EB according to the selection signal SEL<3:0>, and output the second sequence selection signal CK90_SEL. For example, as shown in FIG. 7, the selector 1344 may output the first sequence selection signal CK00_SEL and the second sequence selection signal CK90_SEL by selecting the first negative clock CK00EB and the second negative clock CK90EB, respectively, according to the selection signal SEL<3:0> of "0001". The selector 1344 may output the first sequence selection signal CK00_SEL and the second sequence selection signal CK90_SEL by selecting the first positive clock CK00ED and the second negative clock CK90EB, respectively, according to the selection signal SEL<3:0> of "0010". The selector 1344 may output the first sequence selection signal CK00_SEL and the second sequence selection signal CK90_SEL by selecting the first negative clock CK00EB and the second positive clock CK90ED, respectively, according to the selection signal SEL<3:0> of "0100". The selector 1344 may output the first sequence selection signal CK00_SEL and the second sequence selection signal CK90_SEL by selecting the first positive clock CK00ED and the second positive clock CK90ED, respectively, according to the selection signal SEL<3:0> of "1000".

The enable signal generator 1346 may activate the output enable signal SEQ_ON in response to the first sequence selection signal CK00_SEL and the second sequence selection signal CK90_SEL, during the activation section of the comparison signal CMP. The enable signal generator 1346 may deactivate the output enable signal SEQ_ON at the end of the activation section/time period of the comparison signal CMP. That is, the enable signal generator 1346 may deactivate the output enable signal SEQ_ON in synchronization with a falling edge of the comparison signal CMP. In detail, the enable signal generator 1346 may include a set signal generator 1346A and a Set/Reset (SR) latch 1346B.

The set signal generator 1346A may generate a set signal S according to the comparison signal CMP, the first sequence selection signal CK00_SEL and the second sequence selection signal CK90_SEL. The set signal generator 1346A may be implemented with a logic gate for performing a logic AND operation on the comparison signal CMP, the first sequence selection signal CK00_SEL and the second sequence selection signal CK90_SEL. The set signal generator 1346A may activate the set signal S to a logic high level during the activation section of the comparison signal CMP, when both of the first sequence selection signal CK00_SEL and the second sequence selection signal CK90_SEL become a logic high level.

The SR latch 1346B may output the output enable signal SEQ_ON which is activated in response to the set signal S and deactivated in response to the inverted comparison signal CMPB.

The output control circuit 136 may include a first latch 136A and a second latch 136B. The first latch 136A may latch the first external clock CK00_EX and output the first main clock CK00, according to the output enable signal SEQ_ON. The first latch 136A may latch the first external clock CK00_EX to output the first main clock CK00 when the output enable signal SEQ_ON is activated, and maintain a level of the first main clock CK00 which is previously latched when the output enable signal SEQ_ON is deactivated. The second latch 136B may latch the second external clock CK90_EX and output the second main clock CK90, according to the output enable signal SEQ_ON. The second latch 136B may latch the second external clock CK090_EX to output the second main clock CK90 when the output enable signal SEQ_ON is activated, and maintain a level of the second main clock CK90 which is previously latched when the output enable signal SEQ_ON is deactivated.

Hereinafter, referring to FIGS. 5 to 8, an operation of the semiconductor device 100 are described in detail.

Figure 8:
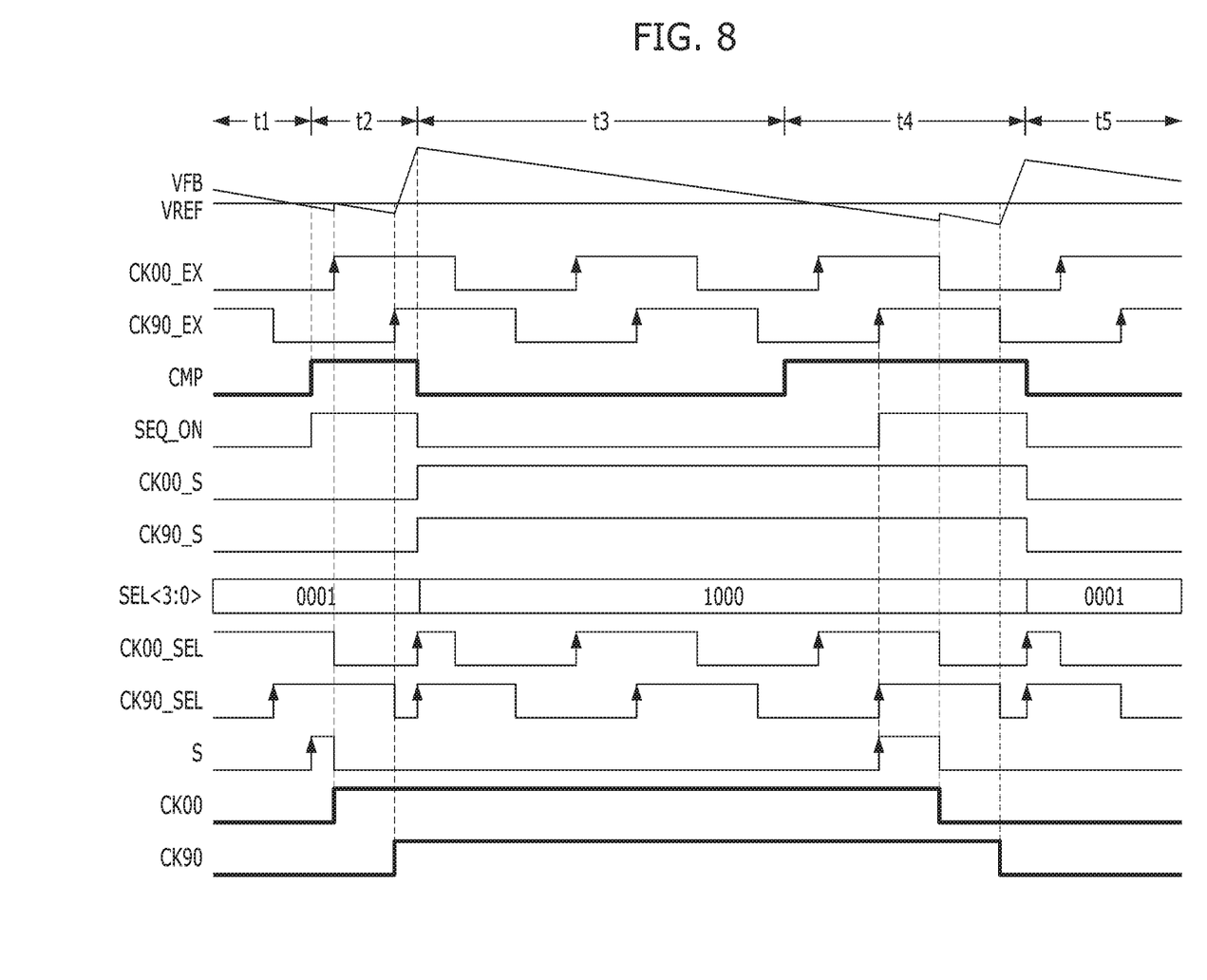
FIG. 8 is a timing diagram describing an operation of a semiconductor device in accordance with an embodiment of the present invention.

FIG. 8 is a timing diagram describing an operation of a semiconductor device in accordance with an embodiment of the present invention.

Referring to FIG. 8, during a first section t1, the detection voltage VFB is greater than or equal to the reference voltage VREF. The voltage detection circuit 120 deactivates the comparison signal CMP to a logic low level. The sequence determination circuit 134 deactivates the output enable signal SEQ_ON to a logic low level. The output control circuit 136 maintains levels of the first and second main clocks CK00 and CK90 without toggling. Accordingly, the charge pump circuit 110 does not perform a pumping operation on the input voltage VIN. Since the previous clock storing circuit 132 stores the first and second preliminary clocks CK00_S and CK90_S of a logic low level, the sequence determination circuit 134 outputs the first sequence selection signal CK00_SEL by inverting the first external clock CK00_EX and outputs the second sequence selection signal CK90_SEL by inverting the second external clock CK90_EX, according to the selection signal SEL<3:0> of "0001".

During a second section t2, the detection voltage VFB becomes lower than the reference voltage VREF. The voltage detection circuit 120 activates the comparison signal CMP to a logic high level. Since the previous clock storing circuit 132 still stores the first and second preliminary clocks CK00_S and CK90_S of a logic low level, the sequence determination circuit 134 outputs the first sequence selection signal CK00_SEL by inverting the first external clock CK00_EX and outputs the second sequence selection signal CK90_SEL by inverting the second external clock CK90_EX, according to the selection signal SEL<3:0> of "0001". The sequence determination circuit 134 activates the set signal S during the activation section of the comparison signal CMP, when both of the first sequence selection signal CK00_SEL and the second sequence selection signal CK90_SEL become a logic high level. The sequence determination circuit 134 activates the output enable signal SEQ_ON in response to the set signal S. The output control circuit 136 outputs the first and second main clocks CK00 and CK90 by latching the first and second external clocks CK00_EX and CK90_EX according to the output enable signal SEQ_ON. Accordingly, the charge pump circuit 110 performs a pumping operation on the input voltage VIN to increase a level of the output voltage VOUT, i.e., the detection voltage VFB.

During a third section t3, the detection voltage VFB becomes greater than the reference voltage VREF. The voltage detection circuit 120 deactivates the comparison signal CMP to a logic low level. The sequence determination circuit 134 deactivates the output enable signal SEQ_ON. The output control circuit 136 maintains the levels of the first and second main clocks CK00 and CK90 without toggling. Accordingly, the charge pump circuit 110 does not perform a pumping operation on the input voltage VIN. At the end of the activation section/time period of the comparison signal CMP, the previous clock storing circuit 132 stores the first and second main clocks CK00 and CK90 of a logic high level as the first and second preliminary clocks CK00_S and CK90_S, respectively. The sequence determination circuit 134 generates the selection signal SEL<3:0> of "1000" according to the first and second preliminary clocks CK00_S and CK90_S of a logic high level. According to the selection signal SEL<3:0> of "1000", the sequence determination circuit 134 outputs the first external clock CK00_EX as the first sequence selection signal CK00_SEL, and outputs the second external clock CK90_EX as the second sequence selection signal CK90_SEL.

During a fourth section t4, the detection voltage VFB becomes lower than the reference voltage VREF. The voltage detection circuit 120 activates the comparison signal CMP to a logic high level. Since the first and second preliminary clocks CK00_S and CK90_S maintain a logic high level, the sequence determination circuit 134 outputs the first external clock CK00_EX as the first sequence selection signal CK00_SEL, and outputs the second external clock CK90_EX as the second sequence selection signal CK90_SEL. The sequence determination circuit 134 activates the set signal S during the activation section of the comparison signal CMP, when both of the first sequence selection signal CK00_SEL and the second sequence selection signal CK90_SEL become a logic high level. The sequence determination circuit 134 activates the output enable signal SEQ_ON in response to the set signal S. Even if the comparison signal CMP is activated to a logic high level, the output enable signal SEQ_ON is not immediately activated, but the output enable signal SEQ_ON is activated when a transition sequence of the first and second external clocks CK00_EX and CK90_EX meets the certain condition. That is, the output enable signal SEQ_ON is activated when both of the first sequence selection signal CK00_SEL and the second sequence selection signal CK90_SEL become a logic high level. The output control circuit 136 outputs the first and second main clocks CK00 and CK90 by latching the first and second external clocks CK00_EX and CK90_EX according to the output enable signal SEQ_ON. Accordingly, the charge pump circuit 110 performs a pumping operation on the input voltage VIN to increase a level of the output voltage VOUT, i.e., the detection voltage VFB.

During a fifth section t5, the voltage detection circuit 120 deactivates the comparison signal CMP to a logic low level. The sequence determination circuit 134 deactivates the output enable signal SEQ_ON. At the end of the activation section/time period of the comparison signal CMP, the previous clock storing circuit 132 stores the first and second main clocks CK00 and CK90 of a logic low level as the first and second preliminary clocks CK00_S and CK90_S, respectively. According to the selection signal SEL<3:0> of "0001", the sequence determination circuit 134 outputs the first sequence selection signal CK00_SEL by inverting the first external clock CK00_EX and outputs the second sequence selection signal CK90_SEL by inverting the second external clock CK90_EX.

As described above, the driving control circuit 130 of the semiconductor device 100 in accordance with an embodiment may output the first and second main clocks CK00 and CK90 by determining whether a transition sequence of the first and second external clocks CK00_EX and CK90_EX meets a certain condition, based on logic levels of the first and second preliminary clocks CK00_S and CK90_S, during the activation section of the comparison signal CMP. Further, the driving control circuit 130 may control the first and second main clocks CK00 and CK90 to maintain their logic levels by storing the first and second main clocks CK00 and CK90 as the first and second preliminary clocks CK00_S and CK90_S, respectively, at the end of the activation section/time period of the comparison signal CMP. Accordingly, the semiconductor device 100 can control the first and second main clocks CK00 and CK90 not to simultaneously transition, and can minimize/reduce current consumption due to unnecessary switching operations.

Figure 9A:
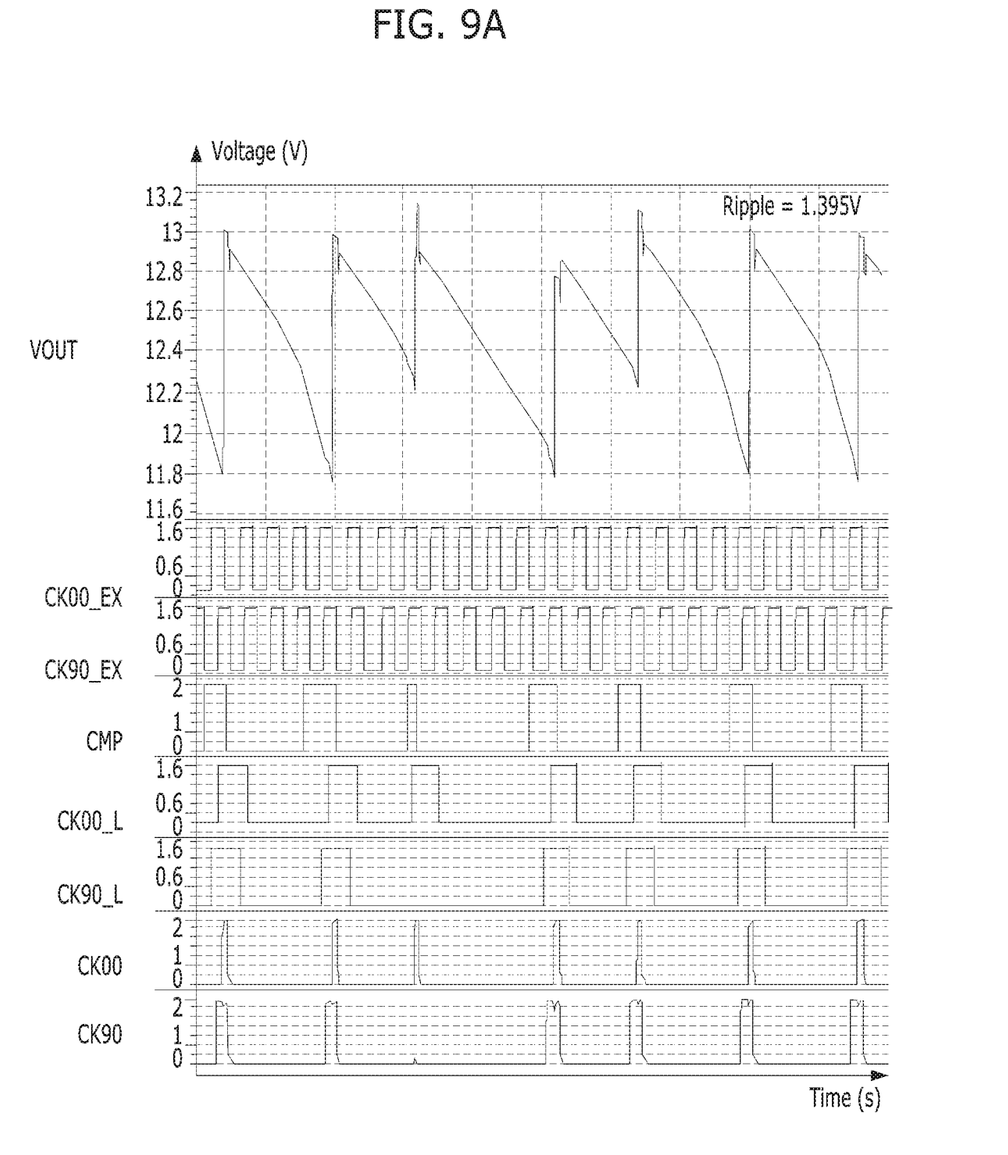
FIGS. 9A and 9B are timing diagrams describing an operation of a semiconductor device in the context of a comparative example, and an operation of a semiconductor device according to an embodiment of the present invention, respectively.

FIG. 9A is a timing diagram describing an operation of a semiconductor device according to a comparative example, and FIG. 9A is a timing diagram describing an operation of a semiconductor device according to an embodiment of the present invention.

Referring to FIG. 9A, in a case of the semiconductor device according to the comparative example, e.g., the semiconductor device 20 of FIG. 3, first and second main clocks CK00 and CK90 simultaneously transition at an end of an activation section/time period of a comparison signal CMP. Thus, a peak current consumed due to such switching operations may increase, thereby increasing a ripple voltage up to 1.395V. Further, during the activation section of the comparison signal CMP, only the first main clock CK00 toggles, without toggling the second main clock CK90, which increases a current consumption due to unnecessary switching operations.

Figure 9B:
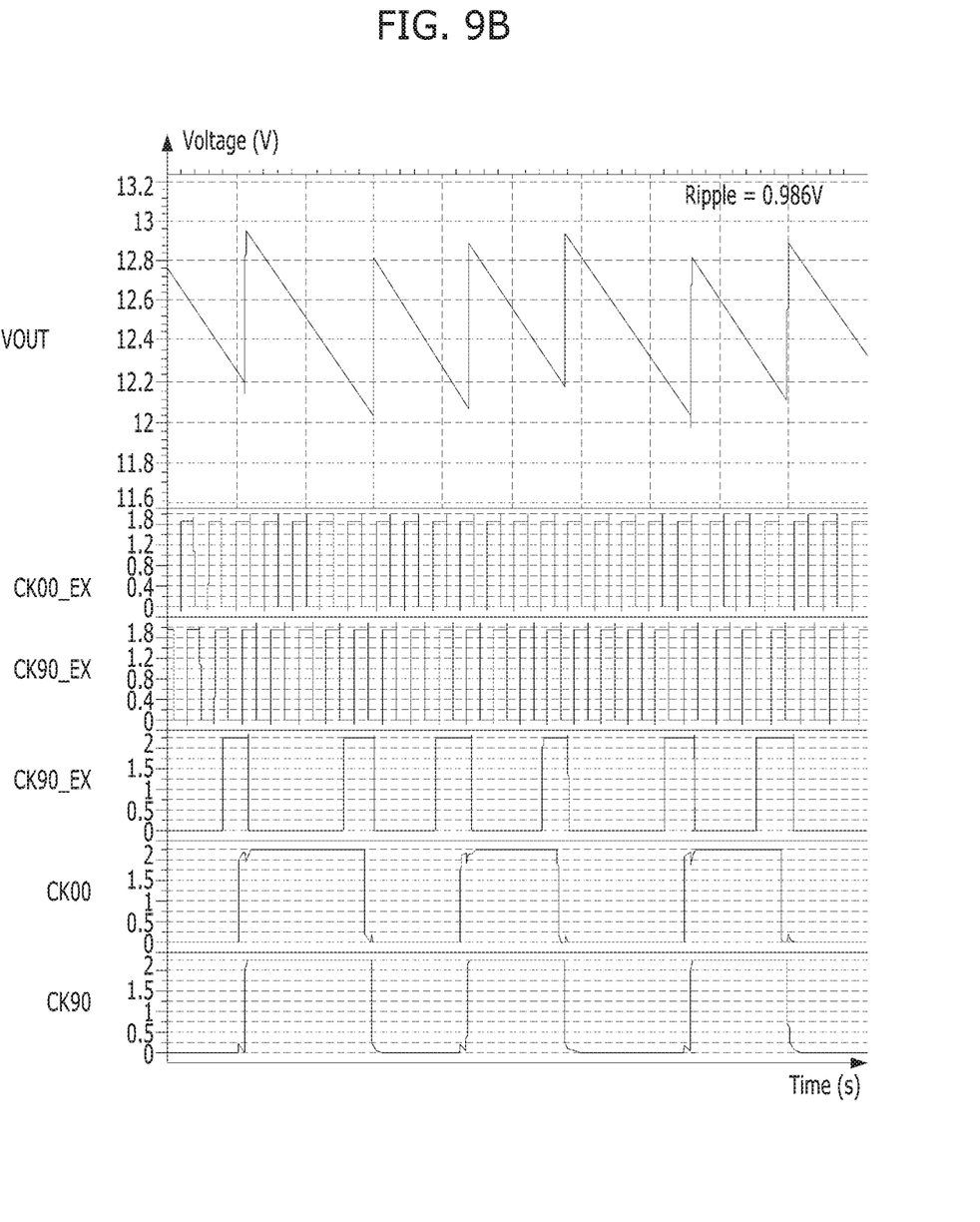

Referring to FIG. 9B, according to an embodiment, in a semiconductor device, e.g., the semiconductor device 100 of FIG. 5, first and second main clocks CK00 and CK90 maintain their logic levels at an end of an activation section/time period of a comparison signal CMP. Since a situation in which the first and second main clocks CK00 and CK90 simultaneously transition is eliminated, a peak current may decrease, thereby decreasing a ripple to 0.986V. Further, by controlling a transition sequence such that the second main clock CK90 transitions after the first main clock CK00 transitions, unnecessary switching operations are eliminated, thereby minimizing/reducing current consumption.

As described above, in accordance with embodiments of the present embodiment, the semiconductor device can minimize current consumption due to input clocks of the charge pump circuit, thereby reducing overall power consumption, and thus improving the power efficiency.

While embodiments of the present invention have been illustrated and described with respect to specific embodiments, the disclosed embodiments are not intended to be restrictive. Further, it is noted that the present invention may be achieved in various ways through substitution, change, and modification, as those skilled in the art will recognize in light of the present disclosure, without departing from the spirit and/or scope of the present disclosure. The present invention is intended to embrace all such substitutions, changes and modifications that fall within the scope of the following claims.

Also, dispositions and types of the logic gates and transistors described in the aforementioned embodiments may be implemented differently based on the polarity of the inputted signal.

What is claimed is:

1. A semiconductor device comprising:
a charge pump circuit for generating an output voltage by pumping an input voltage according to a first main clock and a second main clock;
a voltage detection circuit for generating a comparison signal by comparing the output voltage with a reference voltage; and
a driving control circuit for generating the first main clock and the second main clock according to a first external clock and a second external clock during an activation time period of the comparison signal while controlling a transition sequence such that the second main clock transitions to a logic high level or to a logic low level after the first main clock respectively transitions to a logic high level or to a logic low level,
wherein the activation time period is a time period during which the comparison signal is set to a logic high level by the voltage detection circuit, and
wherein the driving control circuit includes:
a previous clock storing circuit for storing the first main clock and the second main clock as a first preliminary clock and a second preliminary clock, respectively, according to the comparison signal;
a sequence determination circuit for generating an output enable signal by determining whether a transition sequence of the first external clock and the second external clock meets a condition, based on the first preliminary clock and the second preliminary clock, during the activation time period of the comparison signal; and
an output control circuit for outputting the first main clock and the second main clock by latching the first external clock and the second external clock according to the output enable signal.

2. The semiconductor device of claim 1, wherein, during the activation time period of the comparison signal, the driving control circuit controls:
the second main clock to transition to a logic high level from a logic low level after the first main clock transitions to a logic high level from a logic low level, and
the second main clock to transition to a logic low level from a logic high level after the first main clock transitions to a logic low level from a logic high level.

3. The semiconductor device of claim 1, wherein the driving control circuit controls:
the first main clock and the second main clock to maintain their logic levels at an end of the activation time period of the comparison signal.

4. The semiconductor device of claim 1, wherein the previous clock storing circuit includes:
a first storage for storing the first main clock to output the first preliminary clock at an end of the activation time period of the comparison signal; and
a second storage for storing the second main clock to output the second preliminary clock at the end of the activation time period of the comparison signal.

5. The semiconductor device of claim 1, wherein the sequence determination circuit includes:
a logic decoder for generating a selection signal by decoding logic levels of the first preliminary clock and the second preliminary clock;
a selector for selecting one of the first external clock and an inverted signal of the first external clock to output a first sequence selection signal, and selecting one of the second external clock and an inverted signal of the second external clock to output a second sequence selection signal, according to the selection signal; and
an enable signal generator for generating the output enable signal according to the comparison signal, the first sequence selection signal and the second sequence selection signal.

6. The semiconductor device of claim 5, wherein the enable signal generator
activates the output enable signal in response to the first sequence selection signal and the second sequence selection signal, during the activation time period of the comparison signal; and
deactivates the output enable signal at the end of the activation time period of the comparison signal.

7. The semiconductor device of claim 6, wherein the enable signal generator includes:
a set signal generator for generating a set signal in response to the first sequence selection signal and the second sequence selection signal, during the activation time period of the comparison signal; and
a Set/Reset (SR) latch for outputting the output enable signal which is activated in response to the set signal and deactivated in response to an inverted signal of the comparison signal.

8. The semiconductor device of claim 1, wherein the output control circuit includes:
a first latch for latching the first external clock to output the first main clock according to the output enable signal; and
a second latch for latching the second external clock to output the second main clock according to the output enable signal.

9. A semiconductor device comprising:
a charge pump circuit for generating an output voltage by pumping an input voltage according to a first main clock and a second main clock;
a voltage detection circuit for generating a comparison signal by comparing the output voltage with a reference voltage; and
a driving control circuit for generating the first main clock and the second main clock according to a first external clock and a second external clock during an activation time period of the comparison signal while controlling a transition sequence such that the second main clock transitions to a logic high level or to a logic low level after the first main clock respectively transitions to a logic high level or to a logic low level,
wherein the activation time period is a time period during which the comparison signal is set to a logic high level by the voltage detection circuit,
wherein the charge pump circuit includes two or more pump stages coupled in series, and
wherein the charge pump circuit drives odd-numbered pump stages according to the first main clock and a first sub clock which is an inverted signal of the first main clock, and drives even-numbered pump stages according to the second main clock and a second sub clock which is an inverted signal of the second main clock.

10. The semiconductor device of claim 9, wherein the first main clock and the second main clock have a phase difference of 90 degree.

11. An operating method of a semiconductor device, comprising:
Generating a first main clock and a second main clock by respectively latching a first external clock and a second external clock according to an output enable signal;
generating an output voltage by pumping an input voltage according to the first main clock and the second main clock;
generating a comparison signal by comparing the output voltage with a reference voltage; and
generating the output enable signal by determining whether a transition sequence of the first external clock and the second external clock meets a condition during an activation time period of the comparison signal,
wherein the generating of the output enable signal includes:
storing the first main clock and the second main clock as a first preliminary clock and a second preliminary clock, respectively, at an end of the activation time period of the comparison signal;
decoding the logic levels of the first preliminary clock and the second preliminary clock to generate a selection signal;
according to the selection signal, selecting one of the first external clock and an inverted signal of the first external clock to output a first sequence selection signal, and selecting one of the second external clock and an inverted signal of the second external clock to output a second sequence selection signal; and
generating the output enable signal according to the comparison signal, the first sequence selection signal and the second sequence selection signal.

12. The operating method of claim 11, wherein the condition includes one of:
the second external clock transitioning to a logic high level from a logic low level after the first external clock transitions to a logic high level from a logic low level, and
the second external clock transitioning to a logic low level from a logic high level after the first external clock transitions to a logic low level from a logic high level.

13. The operating method of claim 11, further comprising:
maintaining logic levels of the first main clock and the second main clock at the end of the activation time period of the comparison signal.

14. The operating method of claim 11, wherein the generating of the output enable signal according to the comparison signal, the first sequence selection signal and the second sequence selection signal includes:
generating a set signal in response to the first sequence selection signal and the second sequence selection signal, during the activation time period of the comparison signal;
activating the output enable signal in response to the set signal; and
deactivating the output enable signal at the end of the activation time period of the comparison signal.

15. An operating method of a semiconductor device, comprising:
generating a first main clock and a second main clock by respectively latching a first external clock and a second external clock according to an output enable signal;
generating an output voltage by pumping an input voltage according to the first main clock and the second main clock;
generating a comparison signal by comparing the output voltage with a reference voltage; and
generating the output enable signal by determining whether a transition sequence of the first external clock and the second external clock meets a condition during an activation time period of the comparison signal,
wherein the generating of an output voltage by pumping an input voltage according to the first main clock and the second main clock includes
driving odd-numbered pump stages according to the first main clock and a first sub clock which is an inverted signal of the first main clock; and
driving even-numbered pump stages according to the second main clock and a second sub clock which is an inverted signal of the second main clock.

16. The operating method of claim 15, wherein the first main clock and the second main clock have a phase difference of 90 degrees.

* * * * *